(12) United States Patent
Hunter

(10) Patent No.: US 7,898,204 B2
(45) Date of Patent: Mar. 1, 2011

(54) HIGH-SPEED SUBSTRATE MANIPULATOR

(75) Inventor: Bradley Hunter, Lexington, MA (US)

(73) Assignee: Active Precision, Inc., Burlington, MA (US)

( * ) Notice: Subject to any disclaimer, the term of this patent is extended or adjusted under 35 U.S.C. 154(b) by 804 days.

(21) Appl. No.: 11/650,298

(22) Filed: Jan. 5, 2007

(65) Prior Publication Data

US 2008/0166213 A1    Jul. 10, 2008

(51) Int. Cl.
*G05B 19/19* (2006.01)
(52) U.S. Cl. ............... 318/568.11; 318/568.12; 318/560; 318/649
(58) Field of Classification Search .................. 318/135, 318/649, 560, 568.11, 568.12; 355/53, 72, 355/73, 75; 310/12.01, 12.05, 12.06
See application file for complete search history.

(56) References Cited

U.S. PATENT DOCUMENTS

| | | | |
|---|---|---|---|
| 4,654,571 A | 3/1987 | Hinds | |
| 4,676,649 A * | 6/1987 | Phillips | 356/401 |
| 4,891,526 A * | 1/1990 | Reeds | 250/442.11 |
| 5,140,242 A | 8/1992 | Doran et al. | |
| 5,477,743 A | 12/1995 | Yanagisawa | |
| 5,528,118 A | 6/1996 | Lee | |
| 5,648,690 A | 7/1997 | Hinds | |
| 5,672,816 A * | 9/1997 | Park et al. | 73/105 |
| 6,025,689 A | 2/2000 | Prentice et al. | |
| 6,028,376 A | 2/2000 | Osanai et al. | |
| 6,144,118 A | 11/2000 | Cahill et al. | |
| 6,324,933 B1 | 12/2001 | Waskiewicz et al. | |
| 6,327,026 B1 * | 12/2001 | Wakui | 355/72 |
| 6,437,463 B1 * | 8/2002 | Hazelton et al. | 310/12.06 |
| 6,486,955 B1 * | 11/2002 | Nishi | 356/401 |
| 6,525,803 B2 | 2/2003 | Kwan et al. | |
| 6,693,284 B2 | 2/2004 | Tanaka | |
| 6,741,332 B2 * | 5/2004 | Nishi | 355/72 |
| 6,756,751 B2 | 6/2004 | Hunter | |
| 6,816,232 B2 * | 11/2004 | Takahashi et al. | 355/53 |
| 6,917,412 B2 * | 7/2005 | Poon et al. | 355/72 |
| 6,940,582 B1 * | 9/2005 | Tanaka | 355/53 |
| 7,002,668 B2 * | 2/2006 | Rivin | 355/72 |
| 7,116,396 B2 * | 10/2006 | Tsuji et al. | 355/30 |
| 7,145,270 B2 * | 12/2006 | Mizuno | 310/12.19 |
| 7,202,937 B2 * | 4/2007 | Kwan et al. | 355/53 |

(Continued)

FOREIGN PATENT DOCUMENTS

EP        0 437 741 A2    7/1991

(Continued)

OTHER PUBLICATIONS

J. W. Ryu, et al., "Optimal design of a flexure hinge based XYθ wafer stage," *Precision Engineering* 21: Jul. 18-28, 1997.

(Continued)

*Primary Examiner* — Bentsu Ro
*Assistant Examiner* — Antony M Paul
(74) *Attorney, Agent, or Firm* — Muirhead and Saturnelli, LLC

(57) ABSTRACT

A mechanism for manipulation of a substrate over a substantially planar region has at least three, and up to six, degrees of freedom (DOF). The mechanism may be manufactured in various configurations, including triangular, and may use inherent symmetry to reduce the number of distinct components that must be manufactured. The mechanism may use parallelism to reduce the moving mass and thereby achieve higher levels of performance using less expensive motors while dissipating less power.

20 Claims, 12 Drawing Sheets

U.S. PATENT DOCUMENTS

| | | | |
|---|---|---|---|
| 7,362,115 B2 * | 4/2008 | Andrews et al. | 324/755 |
| 7,385,370 B2 * | 6/2008 | Sekiguchi | 318/575 |
| 7,557,529 B2 * | 7/2009 | Tanaka | 318/649 |
| 2004/0165172 A1 | 8/2004 | Poon et al. | |
| 2005/0146169 A1 | 7/2005 | Thallner | |
| 2006/0017908 A1 * | 1/2006 | Mayama | 355/72 |
| 2006/0148109 A1 | 7/2006 | Lin et al. | |
| 2008/0055756 A1 * | 3/2008 | Ishikawa | 359/871 |

FOREIGN PATENT DOCUMENTS

| | | |
|---|---|---|
| EP | 0 437 741 A3 | 7/1991 |
| EP | 1 228 838 A1 | 8/2002 |
| JP | 2000 75927 | 3/2000 |

OTHER PUBLICATIONS

J. P. Merlet, *Parallel Robots*, $2^{nd}$ Edition, Springer: Netherlands, 2006.

* cited by examiner

US 7,898,204 B2

HIGH-SPEED SUBSTRATE MANIPULATOR

TECHNICAL FIELD

This application relates to the field of movement and positioning mechanisms and, more specifically, to a system for controlling the precision manipulation of substrates.

BACKGROUND OF THE INVENTION

Mechanisms for the precision movement and positioning of planar substrates over a substantially planar region may be used in semiconductor manufacturing equipment such as optical lithography, inspection and wafer probing tools. Similar devices may be found in other industries such as read-head manufacturing for the disk drive industry, flat-panel display manufacturing, printed circuit board manufacturing and gene-chip array imaging and analysis.

The semiconductor field presents an interesting example of the challenges that must be met by a substrate positioning system. With each generation of semiconductor device, the precision requirements of the tools used to manufacture the device increase. At the same time, there is a trend to ever larger substrate sizes. Over the previous thirty years of semiconductor manufacturing, substrate sizes have grown from 75 mm diameter to 300 mm diameter. At the same time, the critical dimensions of features on the wafer have decreased from ten microns to 0.1 micron.

One known stage mechanism for controlling planar motion is the H-stage, an example of which is shown in FIG. 1. The H-stage uses three linear motors to control two degrees of freedom. Dual Y motors 21a, 21b drive either ends of an X motor 22. A wafer stage 23 is driven by the X motor 22. A wafer stage 23 slides over a planar base 20. In some cases, a small amount of yaw motion may be controlled by driving the two Y motors 21a, 21b to slightly different dimensions; however, it may be difficult to achieve more than a few milliradians of yaw motion without adding a separate rotary stage 24 on top of the XY carriage. Further, in the H-stage, the X motor 22 dissipates heat directly under the wafer stage 23, which may lead to thermally-induced errors. Additionally, the Y motors 21a, 21b drive an increased mass that includes not only the wafer stage 23 but also the X-axis motor stators that may be made primarily of steel.

The following U.S. patents disclose systems for the manipulation of a substrate over a substantially planar region and are all incorporated herein by reference:

U.S. Pat. No. 4,654,571 to Hinds discloses a planar mechanism including drive coils that are carried by a moving member.

U.S. Pat. No. 4,891,526 to Reeds discloses a device that mounts an XY stage driven by links of varying length on top of a rotary stage.

U.S. Pat. No. 5,140,242 to Doran discloses a stage mechanism including drive links having controllable lengths to allow manipulation of a wafer. The drive links extend outward from the work envelope.

U.S. Pat. No. 6,324,933 to Waskiewicz discloses a stage including links of varying lengths extending outward from the work envelope to manipulate a wafer stage.

U.S. Pat. No. 6,144,118 to Cahill discloses a stage mechanism that incorporates active counterbalance masses to reduce disturbances caused by stage motions.

In addition, in "*Optimal design of a flexure hinge based XYθ wafer stage*", Ryu et al describe a micromotion stage for manipulating wafers over a range of motion of less than 100 microns. The use of flexure hinges in the micromotion stage restricts the range of travel to less than 1 mm in X and Y and less than 1 degree in Theta (or "Yaw").

The requirement to manufacture devices at ever more stringent precision requirements over larger substrate sizes has driven the requirements for stage mechanisms. Pressure to reduce manufacturing costs further aggravates the challenge of stage design for such equipment. Making equipment at lower cost and/or operating equipment at higher production speeds reduces manufacturing costs. However, achieving lower manufacturing costs while simultaneously increasing precision over a larger operating envelope presents a formidable set of requirements for a substrate manipulator.

Accordingly, it would be desirable to provide an economical mechanism that may operate over a substantially planar envelope at high throughput while achieving high-levels of precision. Furthermore, it would be desirable to manipulate a substrate over a range of motion comparable to the substrate size and to do so without shaking or tilting the stage that may be supported by a compliant vibration isolation system.

SUMMARY OF THE INVENTION

According to the system described herein, a substrate positioning apparatus includes a base and a movable stage disposed over a surface of the base and movable within a work envelope. At least three curvilinear actuators are disposed on the base about the work envelope. A curvilinear actuator is a single degree of freedom device that moves along a line of constant radius and applies controllable forces to a drive link. The radius of curvature may be large relative to the dimensions of the manipulator work envelope and may be infinite, in which case the motion is along a straight line. A plurality of fixed length drive links are coupled to the at least three curvilinear actuators through at least a first rotary joint and coupled to the moveable stage through at least a second rotary joint. Motion of the curvilinear actuators drives the plurality of drive links to move the moveable stage within the work envelope. The system may further include a control system that coordinates movement of the curvilinear actuators and at least three counterbalance masses disposed around the work envelope that may be coupled to the control system.

According further to the system described herein, a substrate positioning apparatus includes a base, a movable stage disposed over a substantially planar surface of the base and that moves over the surface within a work envelope, at least three actuators disposed on the base about the work envelope and a plurality of drive links, each drive link being coupled to one of the actuators by a first rotary joint at a first fixed location of the drive link and coupled to the moveable stage by a second rotary joint at a second fixed location of the drive link, where motion of the actuators drive the plurality of drive links to move the moveable stage within the work envelope. The substrate positioning apparatus may also include a control system that coordinates the motion of the actuators. The substrate positioning apparatus may also include at least three counterbalance masses disposed around the work envelope. A control system may be coupled to the at least three counterbalance masses to control positions of the at least three counterbalance masses so as to substantially maintain a center of mass of the base and elements supported by the base at rest. The movable stage may slide on the surface of the base within the work envelope on at least one bearing. The motion of the actuators may move the moveable stage along a trajectory in X, Y and yaw coordinates. The moveable stage may have a range of travel that is greater than one mm in X and Y and greater than one degree in Theta. Four actuators may be disposed about the work envelope and coupled to the plurality of drive links. The substrate positioning apparatus may also include at least one Z-actuator coupled to the movable stage, where the at least one Z-actuator controls Z, roll and pitch dimensions of an upper surface of the movable stage. The substrate positioning apparatus may also include at least three Z-actuators coupled to the movable stage. The base may have an approximately triangular shape and each of the at least three actuators are each disposed along one side of the base. The substrate positioning apparatus may also include at least one passive vibration isolator coupled to the base. The at least three actuators may have strictly linear dimensions. Each of the actuators may be curvilinear with a radius of curvature greater than a radius of the work envelope.

According further to the system described herein, a semiconductor wafer processing device includes a base, a movable stage disposed over a substantially planar surface of the base that moves over the surface within a work envelope, at least three actuators disposed on the base about the work envelope, a plurality of drive links, each drive link being coupled to one of the actuators by a first rotary joint at a first fixed location of the drive link and coupled to the moveable stage by a second rotary joint at a second fixed location of the drive link, where motion of the actuators drive the plurality of drive links to move the moveable stage within the work envelope and semiconductor processing equipment coupled to the base. The motion of the actuators may move the moveable stage along a trajectory in X, Y and yaw coordinates. The moveable stage may have a range of travel that is greater than one mm in X and Y and greater than one degree in Theta.

According further to the system described herein, moving a moveable stage of a semiconductor processing device includes providing at least three actuators disposed on a substantially planar base of the semiconductor processing device about a work envelope of the base, providing a plurality of drive links, each drive link being coupled to one of the actuators by a first rotary joint at a first fixed location of the drive link and coupled to the moveable stage by a second rotary joint at a second fixed location of the drive link, and moving the movable stage over the base within the work envelope by engaging the actuators. The moveable stage may move along a trajectory in X, Y and yaw coordinates. The moveable stage may have a range of travel that is greater than one mm in X and Y and greater than one degree in Theta.

BRIEF DESCRIPTION OF THE DRAWINGS

Embodiments of the system are described with reference to the several figures of the drawings, in which.

DETAILED DESCRIPTION OF VARIOUS EMBODIMENTS

Referring now to the figures of the drawings, the figures comprise a part of this specification and illustrate exemplary embodiments of the described system. It is to be understood that in some instances various aspects of the system may be shown schematically or may be shown exaggerated or altered to facilitate an understanding of the system.

The system described herein provides a mechanism for manipulation of a substrate over a substantially planar region having at least three, and up to six, degrees of freedom (DOF). The mechanism may be manufactured in various configurations with a minimum of design changes in order to serve the largest possible set of requirements. The mechanism may use inherent symmetry to reduce the number of distinct components that must be manufactured. The mechanism may use parallelism to reduce the moving mass and thereby achieve higher levels of performance using less expensive motors while dissipating less power.

According to an embodiment of the system described herein, the stage mechanism (that may be referred to herein as the "Delta Stage") may be a form of parallel robot. Parallel robots, as distinct from serial robots, are characterized by multiple kinematic chains connecting the base with an end effector. A serial robot consists of a single kinematic chain connecting the robot base to the end effector. The kinematic chain is a serial assembly of links and actuators and the end effector may be, for example, a wafer chuck, or the like.

The Delta Stage may be referred to as a "3-PRR" device. The "3" designation implies three DOF. The "PRR" designates the form of the parallel kinematic chains that connect a wafer stage to a base. The "P" indicates that the linear actuators may be designated prismatic joints. The rotary joints on either end of the drive link are designated with an "R".

In the six DOF configuration of the Delta Stage, where three Z actuators provide motion in the Z direction (up/down)

and pitch and roll of the wafer stage, the mechanism may no longer be considered a strictly parallel robot. The three Z actuators are carried by the 3-PRR planar mechanism. Thus, the complete mechanism may be a 3-PPP parallel robot serially connected to a 3-PRR robot. Counter balance masses, as further described elsewhere herein, may be three distinct 1-P mechanisms.

Parallel robots typically offer higher performance than serial robots. The multiple connections between the base and the end effector contribute to increased stiffness. The location of drive motors on the base, as opposed to on intermediate links in the case of a serial mechanism, contributes to reduced moving mass. The use of drive links in tension/compression, rather than in bending, further contributes to increased stiffness with lower moving mass.

Figure 1:
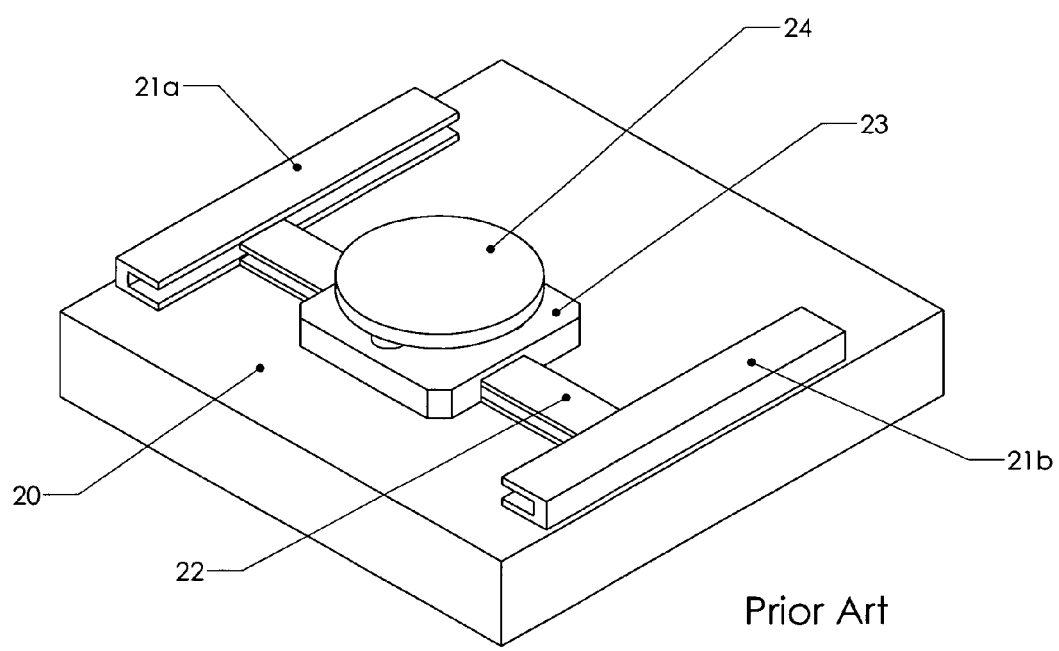
FIG. 1 is a schematic illustration of a prior art H stage.
Figure 2:
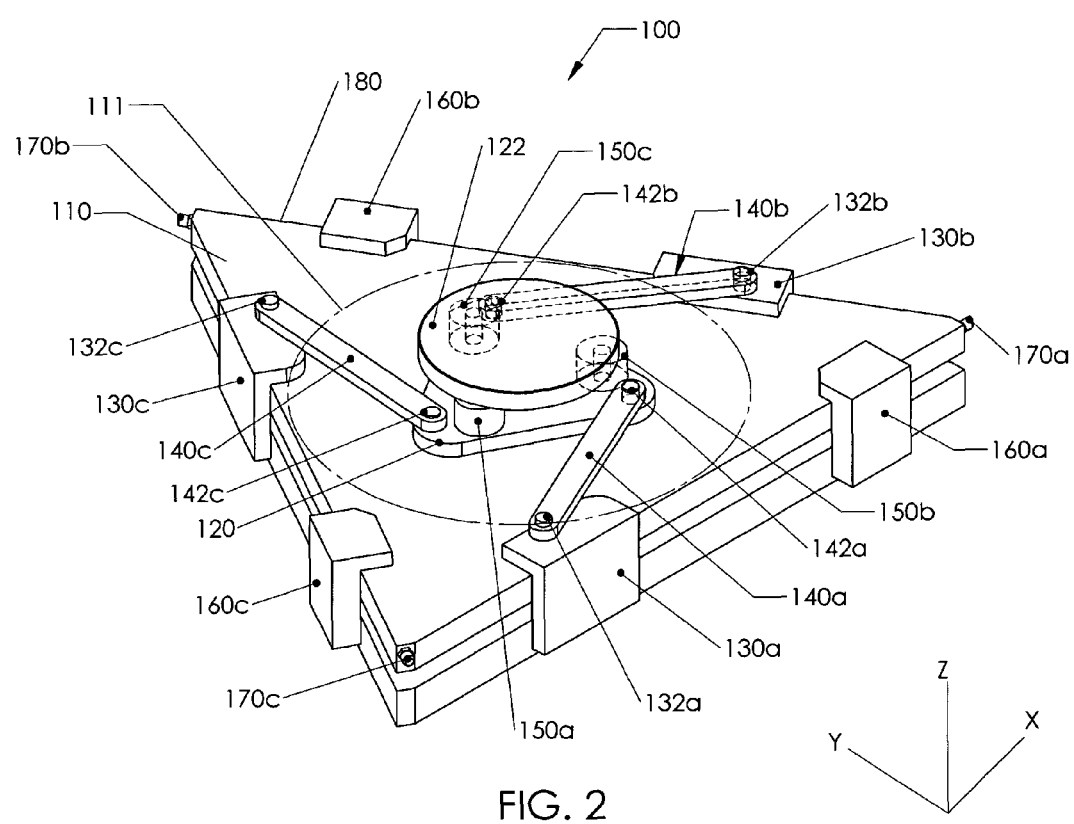
FIG. 2 is a schematic illustration of a stage manipulator mechanism according to an embodiment of the system described herein.

FIG. 2 is a schematic illustration of a stage manipulator mechanism 100 according to an embodiment of the system described herein. The mechanism 100 may include a base 110 upon which a stage assembly 120 slides using a bearing. For example, the bearing may be an air bearing. A wafer stage (such as a chucktop) 122 is coupled to the stage assembly 120 and may include a surface for retention of a substrate preferably using vacuum. As shown, the base 110 has an approximately triangular shape although other shapes may be suitable for use, as further discussed elsewhere herein. Three linear actuators 130a, 130b, 130c may surround the base 110 in a symmetric fashion. Three drive links 140a, 140b, 140c may be coupled to the linear actuators 130a-c by rotational joints 132a, 132b, 132c that connect the drive links 140a-c to the actuators 130a-c. The drive links 140a-c may also be coupled to the stage assembly 120 by rotational joints 142a, 142b, 142c. The stage assembly 120 may be within a circular work envelope 111 manipulated by the linear actuators 130a-c and the drive links 140a-c. The actuators 130a-c may be disposed outside of the work envelope 111. Three Z actuators 150a, 150b, 150c may be located in the stage assembly 120 to provide actuation and guidance to the underside of the wafer stage 122.

Each of the rotational joints 132a-132c is at a first fixed location of the corresponding one of the drive links 140a-140c while each of the rotational joints 142a-142c is at a second fixed location of the corresponding one of the drive links 140a-140c. This configuration maintains a substantially constant distance between any two corresponding ones of the rotational joints 132a-132c, 142a-142c throughout the range of motion of the stage 122. Thus, for example, the distance between the rotational joint 132a and the rotational joint 142a is maintained substantially constant independent of the motion and location of the stage 122. Similarly, the distance between the rotational joint 132b and the rotational joint 142b is maintained substantially constant and the distance between the rotational joint 132c and the rotational joint 142c is maintained substantially constant. Note that the term "rotational joint" as used herein includes any configuration that allows the drive links 140a-140c to be attached to the stage 122 and to corresponding one of the actuators 130a-130c while allowing rotation of the drive links 140a-140c at the attachment points. The use of the rotational joints 132a-132c, 142a-142c and corresponding components allows for the wafer stage 122 to have a range of travel greater than one mm in X and Y and greater than one degree in Theta (or "Yaw"). Thus, the system described herein is more useful than, and has significant advantages over, certain prior art systems.

As further discussed elsewhere herein, three counter balance masses 160a, 160b, 160c may also be included that are used to cancel reaction forces that would otherwise shake the stage sub-system whenever the stage is moved, and three inertial sensors 170a, 170b, 170c, such as geophones or accelerometers, may be located along the sides of the base 110 and used in a feedback control system to drive the counterbalance masses 160a-c. The counterbalance masses 160a-c may be driven by any appropriate means, including conventional methods such as a motor assembly incorporated within the counterbalance masses 160a-d. A control system 180 may also be provided to receive information from and control the above-noted components, as further described elsewhere herein.

Although three linear actuators 130a-c, three drive links 140a-c, three Z actuators 150a-c and three counter balance masses 160a-c are described herein, other numbers of these components may be suitable for use with the system described herein. In addition, although components may be illustrated as being coupled directly (e.g., the drive links 140a with the stage assembly 120 by rotational joints 142a), it will be understood by one of ordinary skill in the art that the description herein includes instances where components are not necessarily directly coupled.

For convenience of explanation, a Cartesian coordinate system is defined herein as follows. The origin of the coordinate system may be at the center of the base 110 (this origin is convenient, though arbitrary). The X axis may be defined as parallel to the axis of motion of one of the linear actuators 130a-c (again, an arbitrary axis designation). The Y axis is perpendicular to the X axis and parallel to the plane of the base 110. By convention, the Z axis is perpendicular to the base 110, positive moving away from the base plane. The three rotation directions, referred to as roll, pitch and yaw are defined using the right-hand convention around the X, Y and Z-axes respectively. Rotation around the Z axis may be referred to as "Theta" or "θ".

The three linear actuators 130a-c may be operated so as to slide the stage assembly 120 on the base plane of base 110 to a desired X, Y and yaw position. There may be a unique correspondence between every {X, Y, yaw} position of the stage assembly 120 and the corresponding position of the three linear actuators 130a-c. Instead of strictly linear actuators 130a-c, curvilinear actuators may be used, as further described elsewhere herein. The stage assembly 120 may also incorporate the three Z actuators 150a-c. The three Z actuators 150a-c may be located in a symmetric arrangement about the center of the stage assembly 120. The Z actuators 150a-c may control the position of the wafer stage 122 in the Z, roll and pitch directions.

In an embodiment, each of the Z actuators 150a-c may include an air-bearing guided cylindrical sleeve (see, for example, U.S. Pat. No. 6,756,751 to Hunter, which is incorporated herein by reference). The cylindrical sleeve may act as a nearly frictionless piston inside the cylinder. The lower end (closer to the base) of the air bearing cylinder is closed, thereby forming a pressure chamber. The pressure in the chamber may be controlled by modulating the flow of gas (typically compressed air) into and out of the chamber using a controllable valve. The cylindrical actuator may further incorporate a co-axial electro-magnetic actuator. The pressure in the chamber and the current in the electro-magnetic actuator may be controlled by the control system so as to produce forces in the Z direction with a minimum of power dissipation. In certain applications, only three DOF may be required. Accordingly, it may be possible to eliminate the Z actuators in order to reduce the moving mass of the stage. In a three degree of freedom configuration, the wafer stage 122 may be mounted directly to the stage assembly 120 leading to a lower and lighter manipulator assembly 100.

One surface of the wafer stage 122 may be substantially flat. The substrate may be held on the flat surface 122 using a vacuum. However, alternate configurations may incorporate a hollow wafer stage 122 that would only grip the substrate along a narrow region at the peripheral edge of the substrate.

The drive links 140a-c may be coupled to the three linear actuators 130a-c and to the stage assembly 120 by the rotary joints 132a-c and the rotary joints 142a-c. In an embodiment, the rotary joints 132a-c, 142a-c may include cylindrical air bearings. In alternate embodiments, one or both ends of the drive links 140a-c may utilize mechanical bearings. In some applications, rotary flexure bearings may be used. The drive links 140a-c are shown as thin plates but may be any suitable mechanism for transferring the movement of the actuators 130a-c to the stage assembly 122. For example, rods may be used.

The linear actuators 130a-c may be configured in a number of known configurations. For applications requiring less precision, mechanical bearings may be employed in the linear actuators 130a-c. Lower performance and more cost-sensitive applications may employ rotary motors driving through any of a number of well-known mechanisms to provide actuator forces. The mechanism may include: ballscrew, leadscrew, friction drive, capstan drive, toothed belt and/or metal belt. Higher precision applications may require the reduced friction and smoother motion of a linear air bearing and direct drive linear motor. Oil hydrostatic bearings may also be used.

Figure 3:
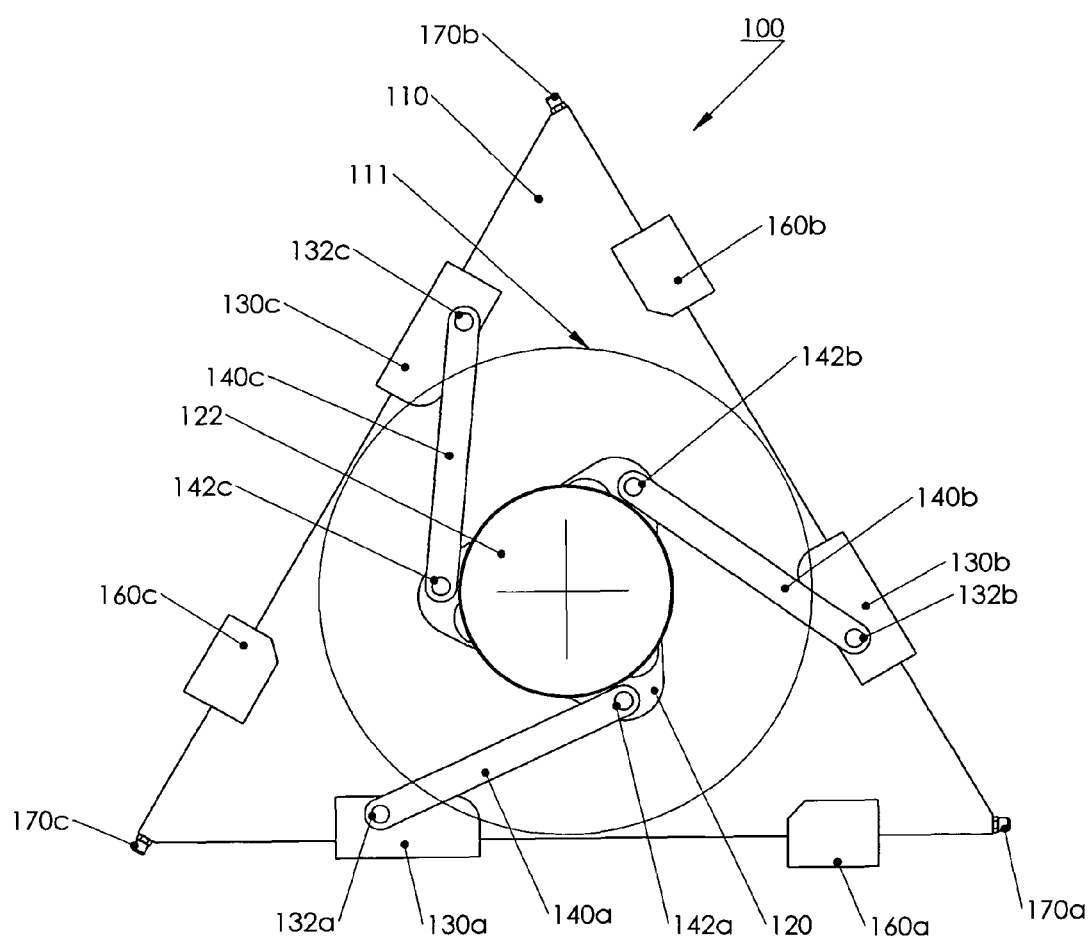
FIG. 3 is a top view schematic illustration of the stage manipulator mechanism showing the wafer stage assembly disposed in a center position of the base according to an embodiment of the system described herein.
Figure 4:
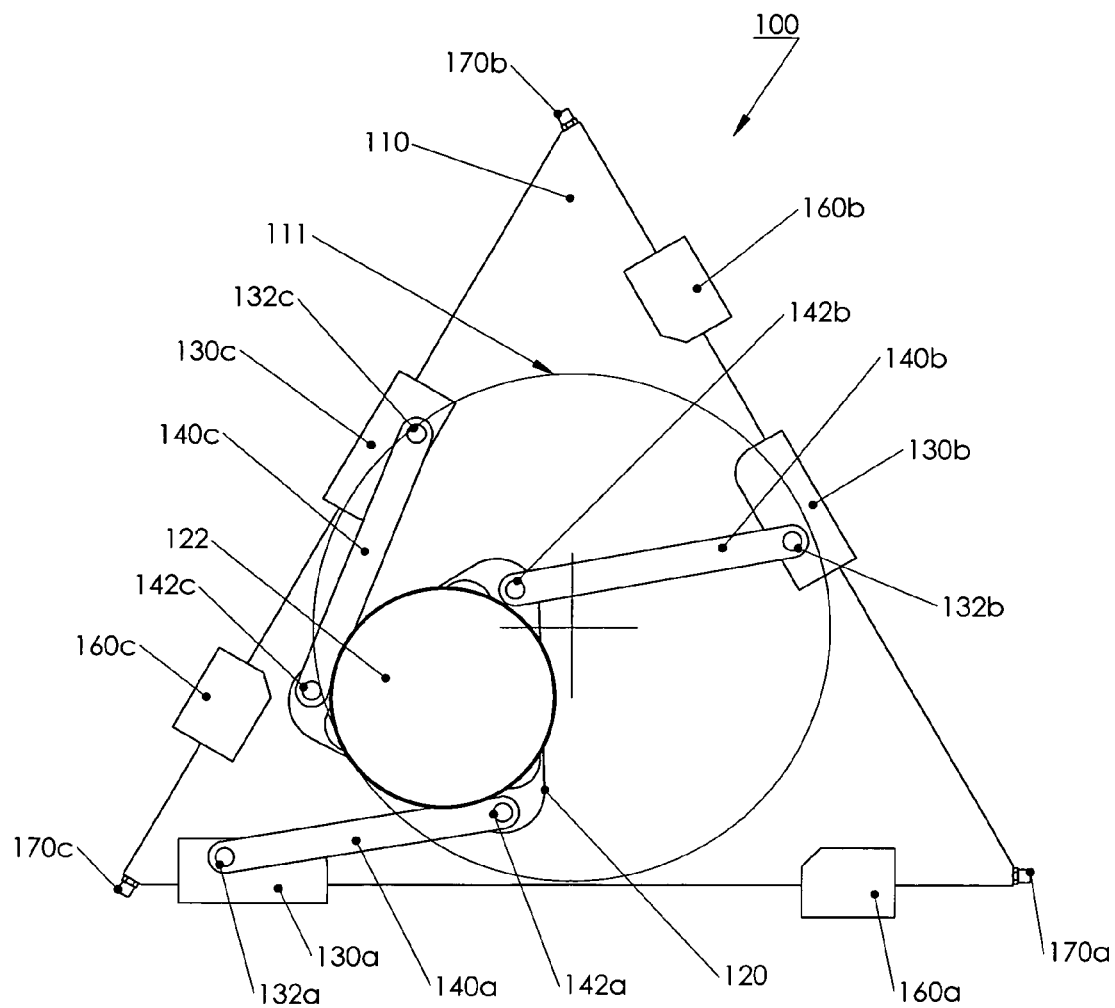
FIG. 4 is a top view schematic illustration of the stage manipulator mechanism showing the wafer stage of a stage assembly disposed in a lower left position on the base according to an embodiment of the system described herein.

FIG. 3 is a top view schematic illustration of the stage manipulator mechanism 100 showing the wafer stage 122 of stage assembly 120 disposed in a center position of the base 110 according to an embodiment of the system described herein. FIG. 4 is a top view schematic illustration of the stage manipulator mechanism 100 showing the wafer stage 122 of the stage assembly 120 disposed in a lower left position on the base 110 according to an embodiment of the system described herein. Components shown in FIGS. 3 and 4 are described elsewhere herein.

As shown in FIGS. 3 and 4, the movements of the actuators 130a-c and drive links 140a-c on each side of the base 110 allow the stage assembly 120 to be positioned as desired within the work envelope 111. In an embodiment, the work envelope 111 may have a diameter of approximately 700 mm that would be suitable for manipulation of a semiconductor wafer diameter of approximately 300 mm. Other diameters for the wafer and/or the work envelope 111 may be employed.

Position of the stage assembly 120 may be measured indirectly by measuring the position of the three linear actuators 130a-c. The linear actuators 130a-c may employ linear encoders for direct measurement of the actuator position or rotary encoders whereby the actuator position is inferred by measuring the rotation of the drive motor of the actuator and accounting for the intervening drive mechanism. Position information from the linear encoders may be transmitted to the control system 180.

Figure 5:
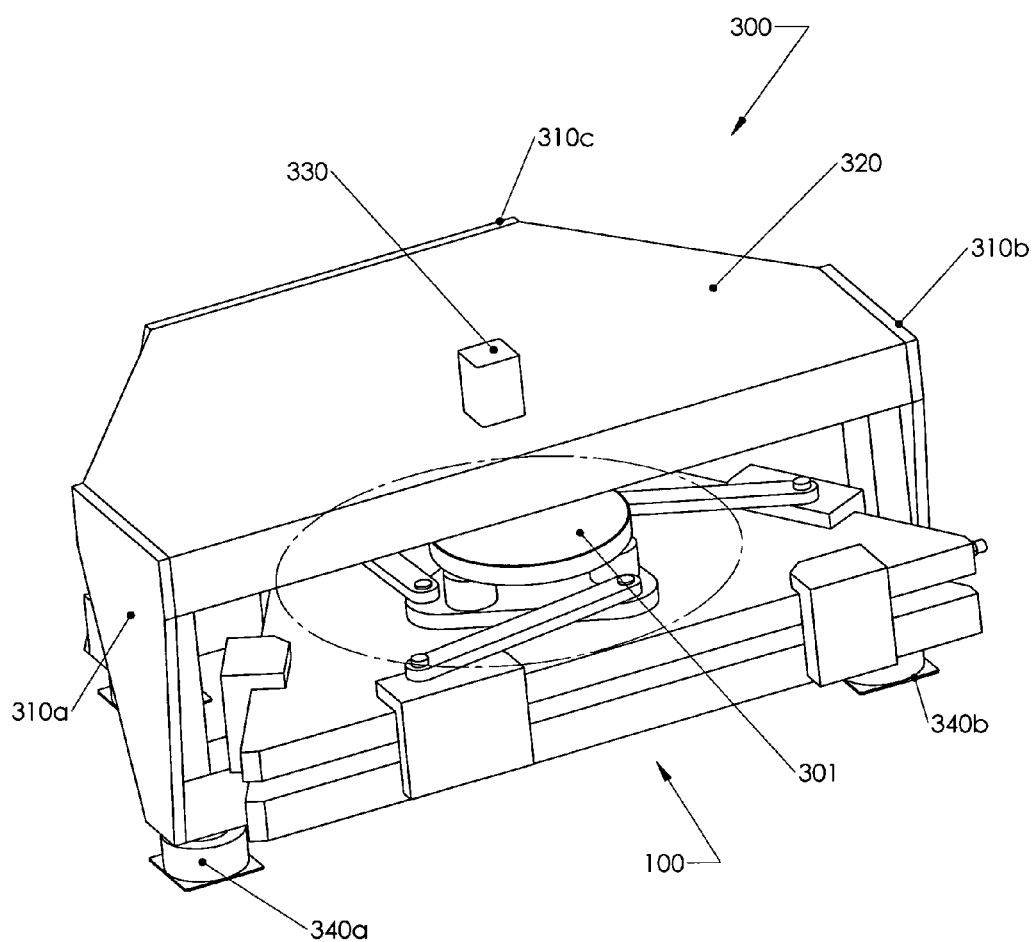
FIG. 5 is a schematic illustration of a semiconductor processing assembly showing the stage manipulator mechanism of FIG. 4 disposed in conjunction with semiconductor process equipment according to an embodiment of the system described herein.

FIG. 5 is a schematic illustration of a semiconductor processing assembly 300 showing the stage manipulator mechanism 100 disposed in conjunction with semiconductor process equipment according to an embodiment of the system described herein. The semiconductor process equipment may include support structures 310a, 310b, 310c, a process equipment platform 320 supported on the support structures 310a-c, and processing equipment 330, such as a tool axis camera disposed on the process equipment platform 320. Any appropriate type of processing equipment may be used. A semiconductor wafer 301 is shown positioned on the wafer stage of the stage manipulator mechanism 100. A vibration isolation system, including vibration isolators 340a, 340b (and a similar isolator associated with support structure 310c, although not shown) are also shown coupled to the support structure 310a-c of the semiconductor process equipment.

Stage mechanisms may incorporate vibration isolation systems to attenuate vibrations transmitted through the floor from reaching the precision process equipment that may be attached to the stage base. In some cases, the isolation system is made as compliant as possible to provide the greatest level of isolation from floor vibrations. However, in cases when only a passive isolation system is used, then whenever the stage moves, two problems may arise. The reaction forces from the stage actuators tend to cause the base to shake on the vibration isolation system. Furthermore, when the stage comes to rest in a new location, the change in location of the center of mass (due to the mass of the stage being in a new location) may cause the entire stage assembly to tilt slightly on the vibration isolation mounts. In some situations, the tilt is tolerable. In other more critical systems, the tilt may be compensated for by various methods such as altering the air pressure in selected isolators in order to restore the stage sub-system to the original state of level. However, the movements of the isolation system represent slight disturbances to the precision equipment mounted to the stage base. In some cases, additional time must be spent after a stage move waiting for the isolation system to complete the necessary adjustment.

The system described herein may address the above-noted problems with the use of the three counter balance masses. The three counter balance masses may be manipulated in such a manner so that the center of mass of everything attached to the stage sub-system remains substantially fixed. If the center of mass of a system of masses remains substantially fixed, then there are no appreciable net external forces applied to the system. In the stage system, this results in the isolation system remaining undisturbed when the stage moves. Tilting due to changing center of mass location when the stage moves from location to location is avoided. The system described herein may incorporate the three counter balance masses 160a-c without the use of a vibration isolation system or, as shown in FIG. 5, the system may use the counter balance masses 160a-c in conjunction with the vibration isolation system components 340a-b.

It should be noted that the system described herein may be used with any appropriate number of counterbalance masses 160a-c to maintain mass balance when the stage moves. However, three counterbalance masses 160a-c may be desirable to maintain mass balance even for movements of the stage in the X and Y dimensions only, while holding yaw fixed. The following scenario describes how the three counterbalance masses 160a-c may be coordinated to maintain balance.

Consider the case of a yaw rotation of the stage assembly 120 about the center of the stage assembly. Furthermore, consider the rotation performed while the stage assembly 120 is located at the geometric center of the base 110 (see FIG. 3). Assuming complete three-fold symmetry (in order to simplify visualization), then all components of the stage movement sub-assembly may be located symmetrically about the center of the base 110. If the stage assembly 120 executes a yaw about the stage assembly center, then the center of mass of everything on the base 110 may remain fixed. The center of mass of the stage assembly may remain fixed since it is located at the stage center and the stage center remains fixed.

It should also be apparent that, due to the symmetry of the system, the center of mass of the three linear actuators 130a-c may also remain fixed. Though each actuator moves along its respective edge of the triangular base 110 while performing the yaw rotation, the center of mass of the three actuators 130a-c may remain at the center of the base 110. Similarly, the center of mass of the three drive links 140a-c may remain at the center of the base 110 during the move. It would appear that the counterbalance masses 160a-c should remain stationary for a yaw rotation.

However, a non-zero torque is applied to the base 110 in the course of rotating the stage assembly 120 (since the stage assembly has non-zero inertia). The counterbalance masses 160a-c may be made to move in order to provide a counter torque to the base 110, resulting in no net forces applied to the vibration isolation system 340a-b. A symmetric movement of the three counterbalance masses 160a-c may create a torque, but, due to symmetry, such a motion may not lead to a net change in the center of mass of the system. Thus, the three counterbalance masses 160a-c may be moved symmetrically (all move the same distance along the sides of the base) to provide balance torques to the base.

For a general motion of the stage that may include yaw, the movement of the counterbalance masses 160a-c is a superposition of the counterbalance positions that achieve mass balance with the positions that achieve torque cancellation.

Referring again to FIG. 2, the control system 180 may coordinate the movement of the counterbalance masses 160a-c based on known masses, inertias and geometry of the components of the stage. For any movement of the stage, there may be a corresponding movement of the counterbalance masses 160a-c that may attempt to provide near perfect cancellation of all forces applied to the base 110. A table may be used to correlate stage movement and movement of the counterbalance masses. However, any imperfection in the estimated mass of elements (an unexpected mass on the wafer stage 122, for instance) may lead to imperfect cancellation. Furthermore, some floor vibrations may propagate through the vibration isolation system 340a-b (see FIG. 6) or across cables connecting the vibration isolated stage and process equipment to the non-isolated frame of the machine. In an embodiment, the counterbalance masses 160a-c may be used in an active vibration isolation system to counteract unexpected net forces applied to the stage base 110, as further discussed herein.

The three inertial sensors 170a-c, such as geophones or accelerometers, may be located along the sides of the base 110. The signal from the sensors 170a-c may be used by the control system 180 as feedback to drive the counterbalance masses 160a-c so as to work to exactly cancel the disturbance forces that would otherwise affect the base 110. In an embodiment, the inertial sensors 170a-c may be located in close proximity and aligned with the axis of motion of the counter balance masses 160a-c. The control calculations that control inertial sensor feedback to counter balance movement may be simplified, and isolation performance is improved, when an inertial sensor 170a-c is nearly co-located with a counterbalance mass 160a-c. The control strategy of the control system 180 for the counterbalance masses 160a-c may determine motions to achieve mass balance, including adding motions to provide compensating torques and adding motions as required to null movement sensed by the inertial sensors 170a-c.

Implementation of the control system 180 to control the various components as described herein, or a subset thereof, is known. See, for example, Merlet, J. P.; "Parallel Robots" 2nd Edition; 2006; Springer; The Netherlands.

Figure 6:
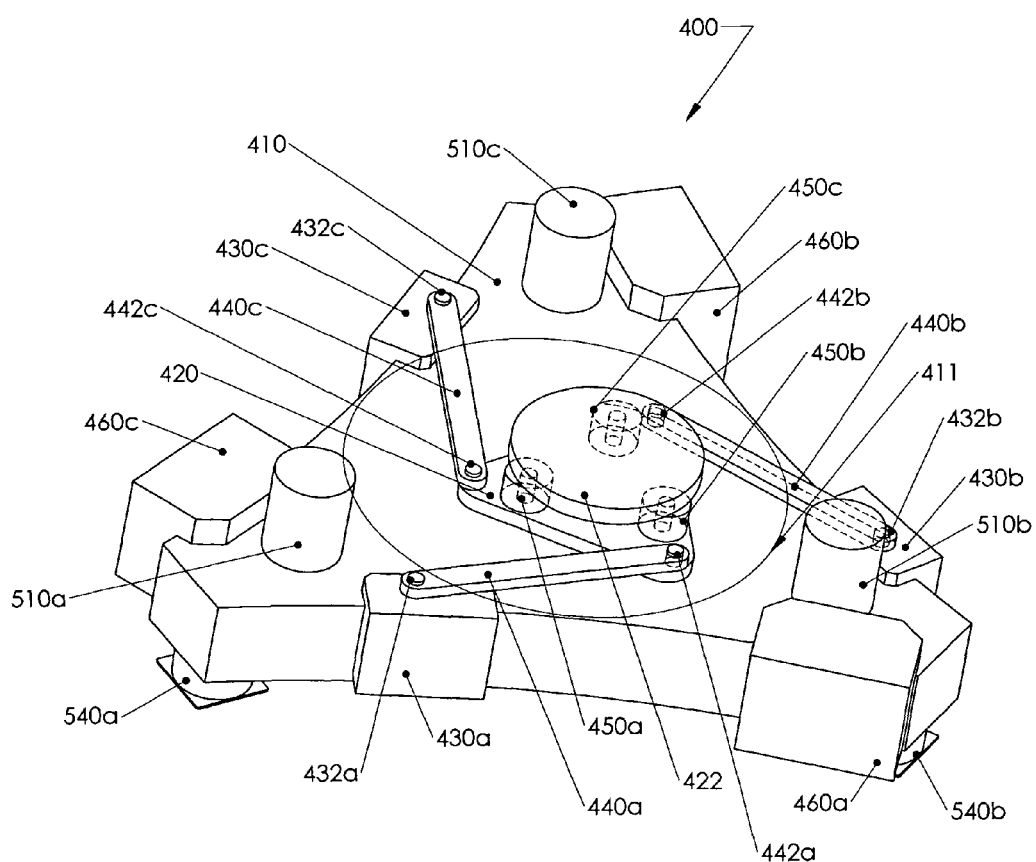
FIG. 6 is a schematic illustration of a substrate manipulator mechanism according to another embodiment of the system described herein in which curvilinear actuators are used.

FIG. 6 is a schematic illustration of a substrate manipulator mechanism 400 according to another embodiment of the system described herein in which curved actuators 430a, 430b, 430c are used. Shown in FIG. 6 is the configuration of the substrate manipulator mechanism 400 based on the use of the curved actuators 430a-c which may be used in conjunction with other components as described elsewhere herein, including: a base 410, a stage assembly 420 that slides over the base 410 within a work envelope 411, a wafer stage 422 coupled to the stage assembly 420, drive links 440a, 440b, 440c coupled to the curvilinear actuators 430a-c, Z actuators 450a, 450b, 450c and counterbalance masses 460a, 460b, 460c.

The drive links 440a-c may be coupled to the actuators 430a-c via rotational joints 432a, 432b, 432c and coupled to the stage assembly 420 via rotational joints 442a, 442b, 442c. The curved actuators 430a-c may be designed with a desired radius of curvature. For example, the curvilinear actuator radius may be approximately 2500 mm. Note that a linear actuator and a curved actuator may both be considered curvilinear actuators with the only distinction being the magnitude of the radius of curvature. A linear actuator is a curvilinear actuator with infinite radius of curvature while a curved actuator may have a large but finite radius of curvature.

Although curved actuators 430a-c may be more complex to manufacture than strictly linear actuators, curved actuators 430a-c may allow for a more economical overall system due to the extra space created in the corners of the triangular base 410. As shown, the extra space may allow the process equipment supports 510a, 510b, 510c and passive vibration isolators 540a, 540b (and a similar isolator in the vicinity of support 510c, although not shown) to be mounted directly to the base 410. Further, the curvature may enable the axes of the actuators 430a-c and drive link 440a-c to remain desirably closer (a smaller angle) over a larger fraction of the working envelope 411. In an embodiment, the radii of curvature of each of the curvilinear actuators 430a-c disposed on the curved sides of the approximately triangular base 410 are greater than the radius, or other similar dimension, of the work envelope 411. The curved sides of the triangular base 410 may each form an arc of a circle that is less than a complete cylinder.

Figure 7:
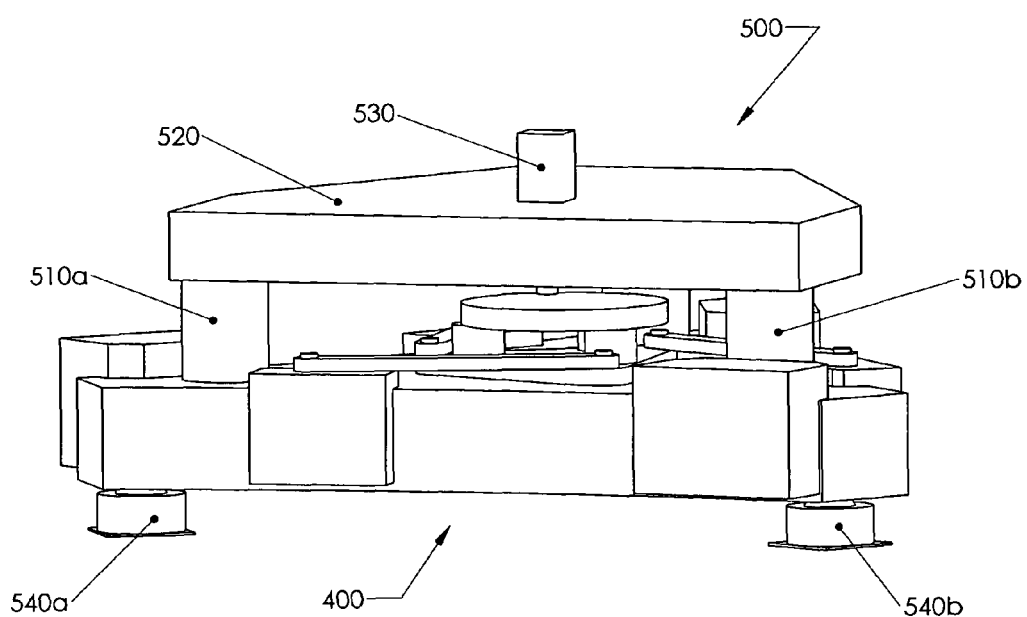
FIG. 7 is a schematic illustration of a semiconductor processing assembly showing the stage manipulator mechanism of FIG. 6 disposed in conjunction with semiconductor process equipment according to an embodiment of the system described herein.

FIG. 7 is a schematic illustration of a semiconductor processing assembly 500 showing the stage manipulator mechanism 400 disposed in conjunction with semiconductor process equipment according to an embodiment of the system described herein. The process equipment supports 510a-b (not shown is support 510c, see FIG. 6) are shown supporting a process equipment platform 520 on which is disposed processing equipment 530, such as a camera or other optical element. The passive vibration isolators 540a-b and process equipment supports 510a-c may be directly (or indirectly) coupled to the base 410 of the mechanism 400.

The triangle configuration with curvilinear actuators 430a-c (and including strictly linear actuators) offers a symmetric work envelope 411. In many cases, this is adequate for some substrates encountered in the semiconductor industry. In certain situations, however, a non-symmetric envelope may be preferred. Parallel robots may be configured with extra kinematic chains that may be used to enhance performance or achieve other objectives. In an embodiment, four "PRR" chains may be used to achieve an asymmetric envelope and/or enhance performance.

Figure 8:
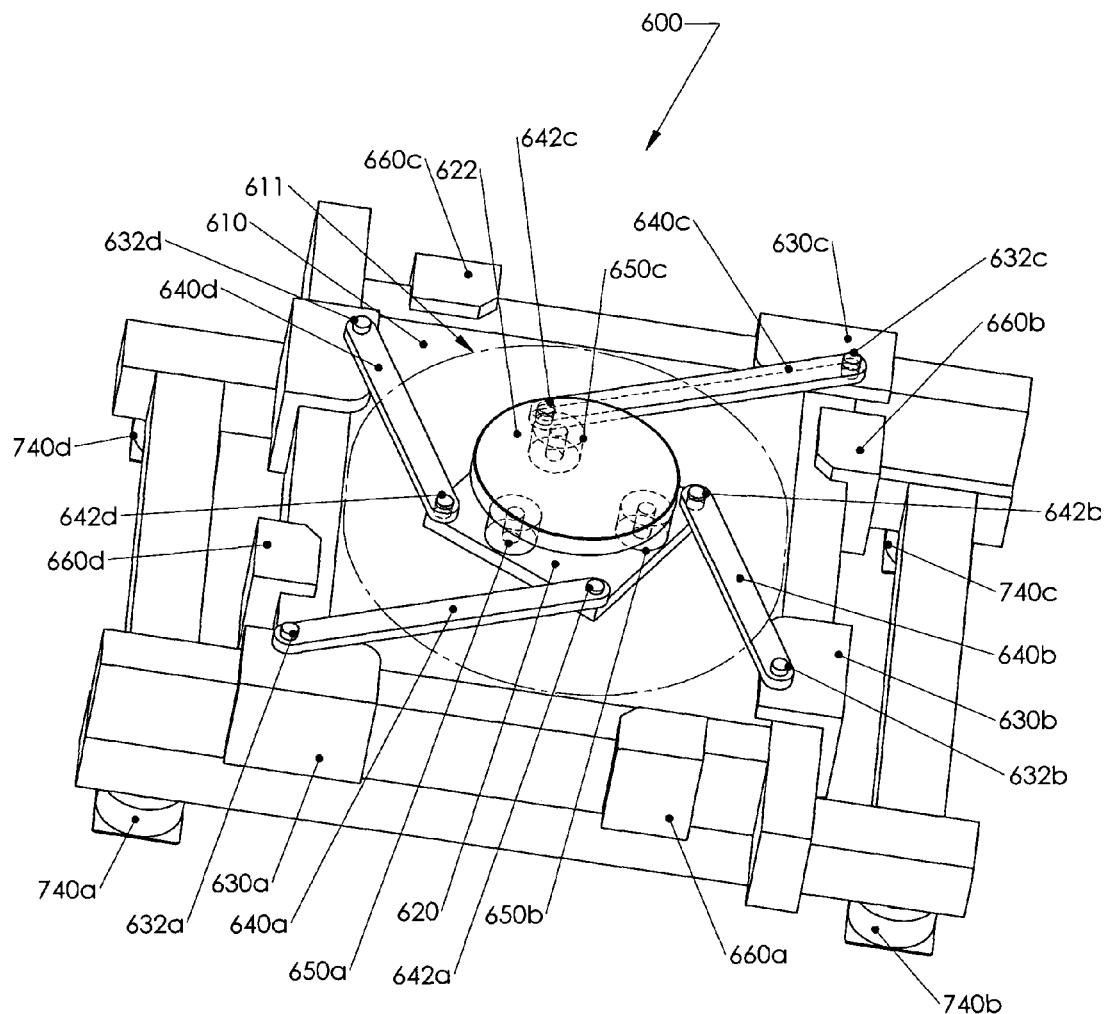
FIG. 8 is a schematic illustration of a stage manipulator mechanism having a rectangular base on which is disposed a stage assembly coupled to four actuators according to an embodiment of the system described herein.

FIG. 8 is a schematic illustration of a stage manipulator mechanism 600 having a rectangular base 610 on which is disposed a stage assembly 620 coupled to four actuators 630a, 630b, 630c, 630d according to another embodiment of the system described herein. The rectangular configuration for the four actuators 630a-d may use longer drive links 640a, 640c and shorter drive links 640b, 640d as used on opposing pairs of actuators 630a-d and that move the stage assembly 620 within an asymmetric work envelope 611. For example, the asymmetric work envelope 611 may have a size of approximately 750 mm×650 mm. Z actuators 650*a-c* may also be included in the mechanism 600 as well as counterbalance masses 660*a-d* and passive vibration isolators 740*a*, 740*b*, 740*c*, 740*d*. The increased range of motion in one axis may simplify wafer-loading operations by allowing the wafer to be moved further away from devices that would otherwise interfere with the wafer during loading operations. The drive links 640*a-d* may be coupled to the actuators 630*a-d* by rotational joints 632*a*, 632*b*, 632*c*, 632*d* and may be coupled to the stage assembly 620 by rotational joints 642*a*, 642*b*, 642*c*, 642*d*.

Figure 9:
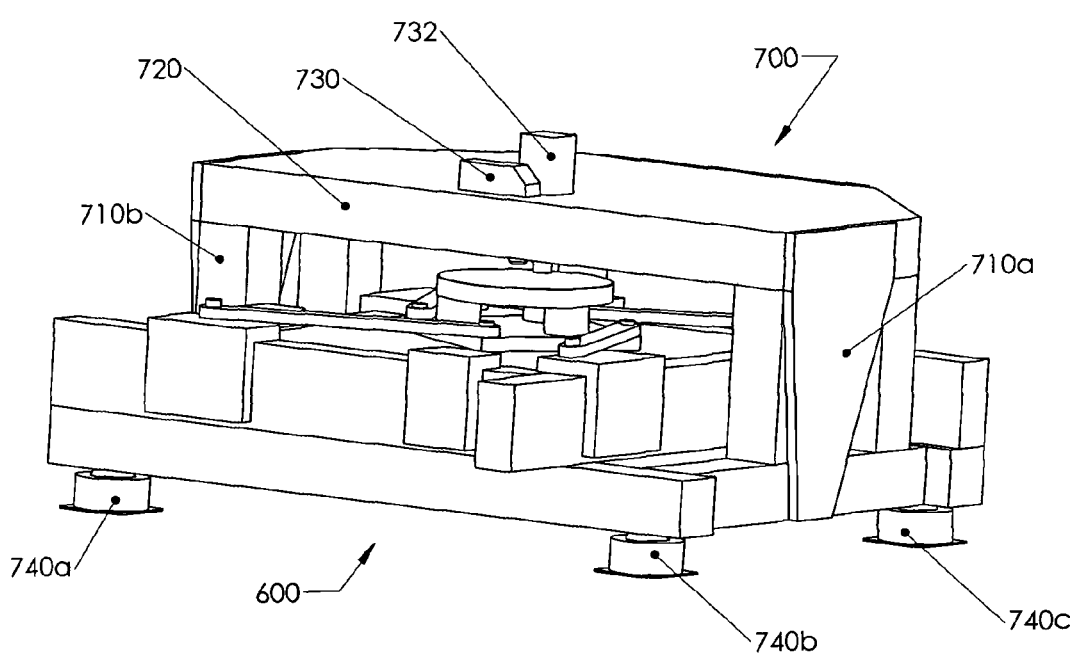
FIG. 9 is a schematic illustration of a semiconductor processing assembly showing the stage manipulator mechanism of FIG. 8 disposed in conjunction with semiconductor process equipment according to an embodiment of the system described herein.

FIG. 9 is a schematic illustration of a semiconductor processing assembly 700 showing the stage manipulator mechanism 600 disposed in conjunction with semiconductor process equipment according to an embodiment of the system described herein. The process equipment supporting structures 710*a*, 710*b* are shown supporting a process equipment platform 720 on which is disposed two processing equipment tools 730, 732. Passive vibration isolators 740*a-d* may be coupled to the stage manipulator mechanism 600.

Additionally, there may be an increase in performance obtained with the use of four actuators 630*a-d* instead of only three. The PRR actuators may be most efficient (maximum acceleration per watt of power dissipated in the motor) when the angle between the linear axis and the drive link is near zero (drive link aligned with actuator axis). The actuator may be least efficient when the actuator to drive link angle is large. With four actuators, at the point where one actuator is least efficient, the opposing actuator may be at its most efficient. With four actuators available to control three DOF, there may exist an infinite number of possible combinations of actuator forces that will produce a single force vector at the wafer stage. The preferred combination, out of the infinite possibilities, may be the set of actuator forces that achieves the desired force vector while dissipating the least amount of power.

Performance may be further improved by adding more than four actuators. Generally, the more actuators used, the more difficult it may be to package the mechanism. The increased difficulty may outweigh the performance advantages. Of course, the cost of a system with redundant actuators (more than three) is greater than with the triangular configuration of three actuators.

Figure 10:
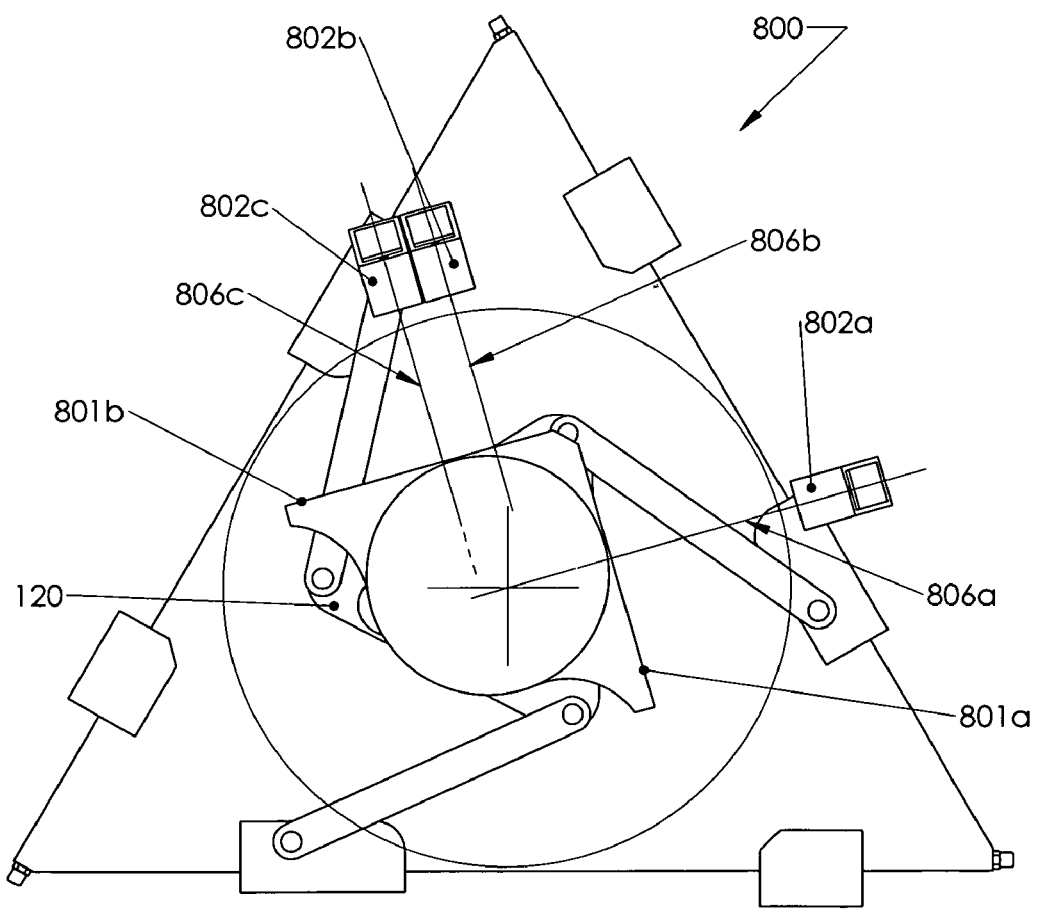
FIG. 10 is a schematic illustration of a substrate manipulation mechanism including a distance measuring interferometer system according to an embodiment of the system described herein.

It is known to use a distance measuring interferometer (DMI) to measure stage position for increased precision. FIG. 10 is a schematic illustration of a substrate manipulation mechanism 200 including a distance measuring interferometry system according to an embodiment of the system described herein. As shown in FIG. 10, the position of the stage assembly 120 may be also measured directly using a distance measuring interferometer (DMI) fixed to the process equipment structure (not shown in FIG. 10) and suitable mirrors 801*a* and 801*b* attached to the stage assembly 120. Two orthogonal mirrors may provide adequate position information in most applications. It is known to use two laser beams separated by a small distance on one mirror to determine one linear dimension and yaw. A third laser beam may be directed at the orthogonal mirror provides the other Cartesian distance measurement.

When a DMI is used, either the yaw DOF may be restricted in order to maintain the stage assembly-mounted mirrors perpendicular to the interferometer beams or an additional degree of freedom may be added to the stage assembly 120 to rotate the wafer stage 122 and the mirrors independently.

Figure 11:
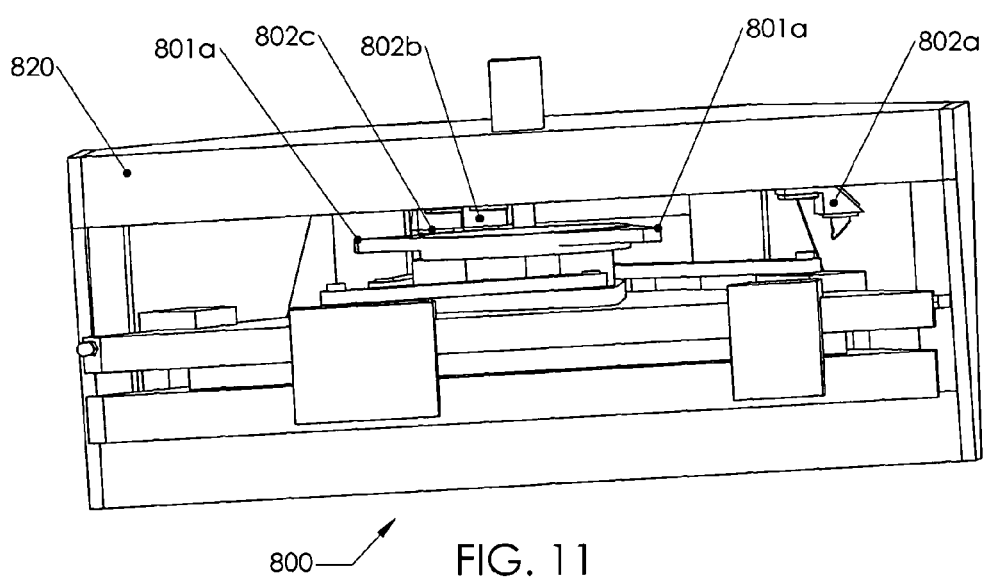
FIG. 11 is a schematic illustration of a semiconductor processing assembly showing the stage manipulator mechanism of FIG. 10 disposed in conjunction with semiconductor process equipment according to an embodiment of the system described herein.

In the illustrated embodiment of FIG. 10 involving a DMI feedback device, yaw motion of the stage may be compensated for by steering the interferometer laser beams using small mirrors driven by small rotary devices (a galvanometer is one example of such a device). The steering of the laser beams nay be coordinated with yaw motion of the stage so as to always maintain the DMI beams perpendicular to the stage-mounted mirrors. The small steering mirrors may be fixed to the underside of the process equipment structure (820) as shown in FIG. 11. It is known to locate the interferometers in close proximity to the process equipment in order to enhance the precision of the tool-to-wafer process.

Steering the laser beams to compensate for Yaw motion of the stage eliminates the need to carry the mass associated with an additional rotary axis mounted on the stage that would otherwise be needed to rotate the mirrors to maintain beam alignment. Furthermore, the elimination of an intervening rotary stage between the interferometer mirrors and the chucktop that would be required in prior art systems ensures that the mirror-to-wafer structure is monolithic, thereby increasing precision.

Figure 12:
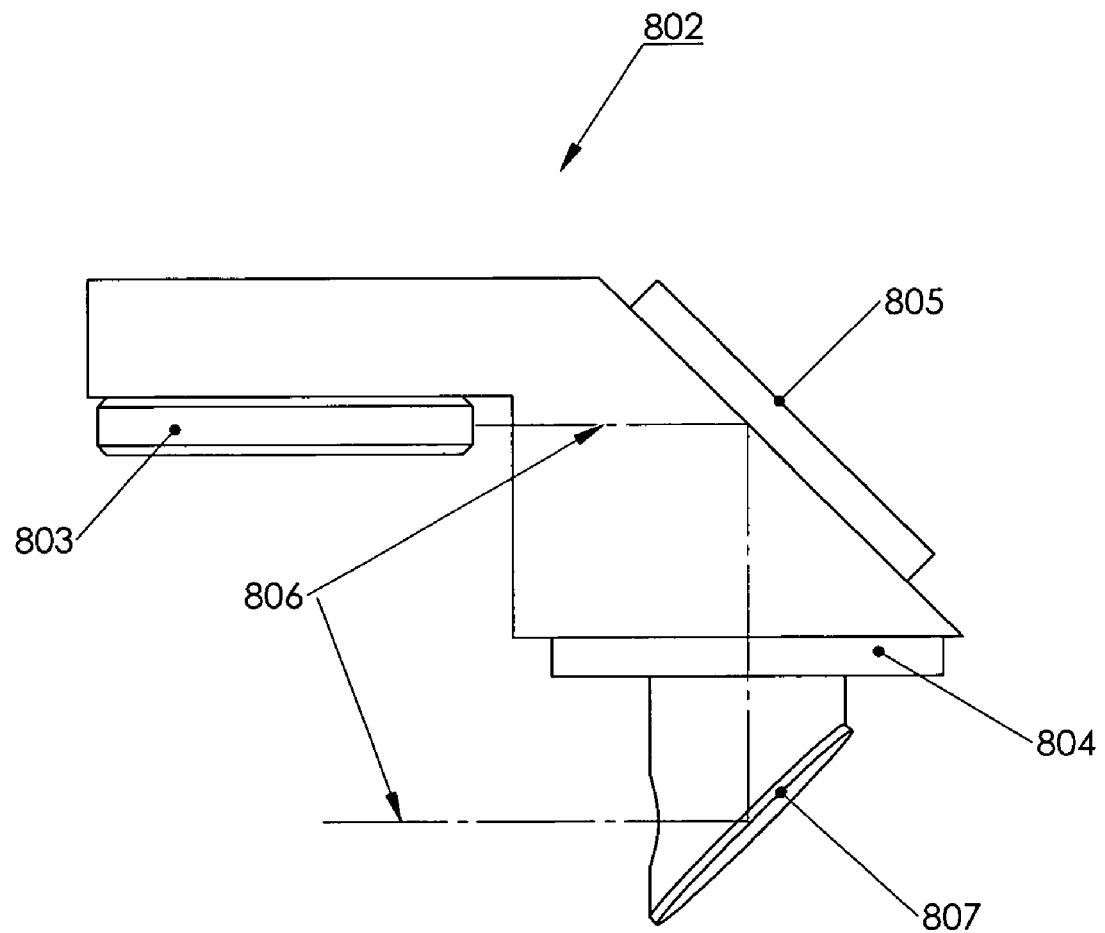
FIG. 12 is a side view illustration of a beam steering mechanism used in conjunction with the distance measuring interferometer of FIG. 10.

FIG. 12 is a side view of one embodiment of a beam steering device 802 suitable for maintaining the interferometer laser beam perpendicular to the stage-mounted interferometer mirrors. An interferometer 803 emits and receives a laser beam 806. The laser beam is directed towards a turning mirror 805 which re-directs the laser beam to be substantially co-axial with the beam steering device 804. The beam steering device may be a galvanometer or a fractional rotation motor with a hollow shaft. A $2^{nd}$ turning mirror 807 re-directs the beam to be substantially parallel to the stage base and perpendicular to the stage mirror 801. The laser beam returning from the stage mirror will return along virtually the same path and recombine within the interferometer 803.

A stage mechanism according to the system described herein provides multiple advantages, as noted below.

Since the stator portion of all actuators may remain fixed to the stage base, the total moving mass is reduced. Known stages used in the semiconductor industry may be more than fifty kilograms. The stage disclosed herein may be economically fabricated at under ten kilograms. The power required to move a stage may increase with the square of the mass. The stage disclosed herein may be operated at the same level of performance, while dissipating less than 10% of the power, of known stages.

The coils of the actuators used to provide X,Y and yaw motions may be located away from the wafer stage. Since the actuators are a source of heat, and heat degrades precision, locating the heat producing elements distant from the stage may lead to improved precision.

Known stage mechanisms may not provide yaw motions over a range of motion beyond a few milliradians. The stage disclosed herein may provide +/−three degrees of motion (which is suitable for the vast majority of semiconductor applications).

The stage disclosed herein may be produced economically due to the degree of symmetry leading to increased manufacturing volumes. Furthermore, the low mass means smaller motors, amplifiers and power supplies may be used thereby leading to further cost savings. Since the same basic design may be used in 3-DOF, 6-DOF, air-bearing or mechanical bearing configurations with or without active vibration isolation, further economies due to manufacturing volume may be achieved.

The stage disclosed herein may not shake either the stage assembly or any precision process equipment attached to the stage. This improves precision and leads to simpler vibration isolation systems. Since shaking or tilting due to stage motion may be nearly eliminated, the machine may be capable of higher throughput.

The stage disclosed herein may be configured with linear encoders on the linear actuators for most applications at a significant cost savings compared to stages that may require distance measuring interferometers (DMI) for stage position feedback. Feedback from a DMI can be used in the most demanding applications. Using stationary beam steering devices enables use of interferometer feedback in applications with significant stage yaw motion. This arrangement may eliminate the mass that would otherwise be required to counterrotate the stage-mounted interferometer mirrors whenever the stage is rotated.

The stage disclosed herein may be compact. This leads to smaller overall machine size, which may be advantageous in a semiconductor clean room where space is extremely valuable.

The triangular configuration provided by the system disclosed herein may lead to a smaller mechanism size. The symmetric configuration may lead to manufacturing economies due to increased volumes of common parts. The triangle configuration may allow active force cancellation to be realized with minimal increase in machine size or cost. The system described herein has the flexibility, however, to be extended to non-triangular configurations if needed or desired.

The embodiments described herein, or any elements thereof, may be used in any suitable combination in accordance with the system described herein. A high-performance stage according to the system described herein may allow manipulation of a semiconductor wafer (for example, 300 mm wafer) over a work envelope that is at least as large as the wafer and offering the benefits of: minimum moving mass; low amount of heat, dissipated remotely from the wafer; yaw motion of a few degrees; balanced motion to reduce system disturbances and center of mass shift; compact package; ability to use either encoders for reduced cost and/or interferometers for increased precision; ability to provide as few as three or as many as six degrees of freedom of motion; and low manufacturing cost.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A substrate positioning apparatus, comprising:
   a base;
   a movable stage disposed over a substantially planar surface of the base and that moves within a moveable stage plane over the surface within a work envelope;
   at least three actuators disposed on the base about the work envelope; and
   a plurality of drive links, each drive link being coupled to one of the actuators by a first rotary joint at a first fixed location of the drive link and coupled to the moveable stage by a second rotary joint at a second fixed location of the drive link, wherein motion of the actuators drive the plurality of drive links to move the moveable stage within the work envelope, wherein the at least three actuators drive the plurality of drive links in a motion within the work envelope, and wherein the at least three actuators constrain the motion of the plurality of drive links within the work envelope to the moveable stage plane that is substantially parallel to the substantially planar surface of the base.

2. The substrate positioning apparatus of claim 1, further comprising:
   a control system that coordinates the motion of the actuators.

3. The substrate positioning apparatus of claim 1, further comprising:
   at least three counterbalance masses disposed around the work envelope.

4. The substrate positioning apparatus of claim 3, wherein a control system coupled to the at least three counterbalance masses controls positions of the at least three counterbalance masses so as to substantially maintain a center of mass of the base and elements supported by the base at rest.

5. The substrate positioning apparatus of claim 1, wherein the movable stage slides on the surface of the base within the work envelope on at least one bearing.

6. The substrate positioning apparatus of claim 1, wherein the motion of the actuators moves the moveable stage along a trajectory in X, Y and yaw coordinates.

7. The substrate positioning apparatus of claim 6, wherein the moveable stage has a range of travel that is greater than one mm in X and Y and greater than one degree in Theta.

8. The substrate positioning apparatus of claim 1, wherein four actuators are disposed about the work envelope and coupled to the plurality of drive links.

9. The substrate positioning apparatus of claim 1, further comprising:
   at least one Z-actuator coupled to the movable stage, wherein the at least one Z-actuator controls Z, roll and pitch dimensions of an upper surface of the movable stage.

10. The substrate positioning apparatus of claim 9, further comprising:
    at least three Z-actuators coupled to the movable stage.

11. The substrate positioning apparatus of claim 1, wherein the base has an approximately triangular shape and each of the at least three actuators are each disposed along one side of the base.

12. The substrate positioning apparatus of claim 1, further comprising:
    at least one passive vibration isolator coupled to the base.

13. The substrate positioning apparatus of claim 1, wherein the at least three actuators have strictly linear dimensions.

14. The substrate positioning apparatus of claim 1, wherein each of the actuators is curvilinear with a radius of curvature greater than a radius of the work envelope.

15. A semiconductor wafer processing device, comprising:
    a base;
    a movable stage disposed over a substantially planar surface of the base and that moves within a moveable stage plane over the surface within a work envelope;
    at least three actuators disposed on the base about the work envelope;
    a plurality of drive links, each drive link being coupled to one of the actuators by a first rotary joint at a first fixed location of the drive link and coupled to the moveable stage by a second rotary joint at a second fixed location of the drive link, wherein motion of the actuators drive the plurality of drive links to move the moveable stage within the work envelope, wherein the at least three actuators drive the plurality of drive links in a motion within the work envelope, and wherein the at least three actuators constrain the motion of the plurality of drive links within the work envelope to the moveable stage plane that is substantially parallel to the substantially planar surface of the base; and
    semiconductor processing equipment coupled to the base.

16. The semiconductor wafer processing device of claim 15, wherein the motion of the actuators moves the moveable stage along a trajectory in X, Y and yaw coordinates.

17. The semiconductor wafer processing device of claim 16, wherein the moveable stage has a range of travel that is greater than one mm in X and Y and greater than one degree in Theta.

18. A method of moving a moveable stage of a semiconductor processing device, comprising:

providing at least three actuators disposed on a substantially planar base of the semiconductor processing device outside a work envelope of the base;

providing a plurality of drive links, each drive link being coupled to one of the actuators by a first rotary joint at a first fixed location of the drive link and coupled to the moveable stage by a second rotary joint at a second fixed location of the drive link; and moving the movable stage within a moveable stage plane over the base within the work envelope by engaging the actuators, wherein the at least three actuators drive the plurality of drive links in a motion within the work envelope, and wherein the at least three actuators constrain the motion of the plurality of drive links within the work envelope to the moveable stage plane that is substantially parallel to the substantially planar surface of the base.

19. The method of claim 18, wherein the moveable stage moves along a trajectory in X, Y and yaw coordinates.

20. The method of claim 19, wherein the moveable stage has a range of travel that is greater than one mm in X and Y and greater than one degree in Theta.

* * * * *